United States Patent [19]

Maier

[11] Patent Number: 4,667,262
[45] Date of Patent: May 19, 1987

[54] DEVICE FOR DETECTING A GROUND FAULT IN THE ROTOR WINDING OF AN ELECTRIC MACHINE

[75] Inventor: Franz Maier, Wettingen, Switzerland

[73] Assignee: BBC Brown, Boveri & Company, Limited, Baden, Switzerland

[21] Appl. No.: 619,992

[22] Filed: Jun. 12, 1984

[30] Foreign Application Priority Data

Jun. 22, 1983 [CH] Switzerland .......................... 3405/83

[51] Int. Cl.$^4$ ............................................. H02H 3/26
[52] U.S. Cl. ........................................ 361/42; 361/46
[58] Field of Search ................... 361/42, 44, 45, 46

[56] References Cited

U.S. PATENT DOCUMENTS

| | | | |
|---|---|---|---|
| 3,959,693 | 5/1976 | Coley et al. | 361/45 |
| 3,999,104 | 12/1976 | Lardennois | 361/42 X |
| 4,012,668 | 3/1977 | Wittlinger | 361/44 |
| 4,015,169 | 3/1977 | Misencik | 361/45 |
| 4,159,499 | 6/1979 | Bereskin | 361/45 X |
| 4,224,652 | 9/1980 | Fiorentzis | 361/42 |
| 4,280,162 | 7/1981 | Tanka et al. | 361/45 |

*Primary Examiner*—Philip H. Leung
*Assistant Examiner*—A. Jonathan Wysocki
*Attorney, Agent, or Firm*—Burns, Doane, Swecker & Mathis

[57] ABSTRACT

In the invention, a ground current, impressed, in the case of a ground fault, by an offset-voltage source connected into an earth line and capacitively coupled to the rotor winding, is detected both in the ground line and in the exciter circuit via at least one current transformer which is preferably constructed as a ring-core transformer. By suitable summing of the ground current flowing in the ground line with that flowing in the exciter circuit, an indication is achieved which is selective with respect to the location of the ground fault in the exciter circuit.

15 Claims, 4 Drawing Figures

4,667,262

DEVICE FOR DETECTING A GROUND FAULT IN THE ROTOR WINDING OF AN ELECTRIC MACHINE

The invention relates to a device for detecting a ground fault in the rotor winding of an electric machine

BACKGROUND OF THE INVENTION

One type of device used for protecting the rotor winding is known, for example, from the article "Electronic Rotor Earth Fault Protection with Novel Measuring Principle" by E. F. Knütter and G. Ziegler in Siemens Journal 46 (1972), Volume 12, pages 906 to 909.

In principle, a single ground fault somewhere in the rotor circuit which, apart from the rotor winding, also includes the exciter source, among others, does not immediately affect the operational characteristics of the machine. It is, therefore, not mandatory in every case to switch the machine off. If the ground fault has occurred, for example, in the exciter source, the machine can be possibly kept in operation until the next routine shutdown. On the other hand, in the case of a ground fault right in the rotor winding, it is desirable to switch the machine off since a further ground fault in the rotor winding could short-circuit a part of the winding through ground and lead to a destruction of the rotor winding. The prerequisite for such a selective shutdown is that the ground fault is detected selectively in accordance with its position in the rotor circuit. The known device basically does not indicate ground faults selectively in the total rotor circuit.

OBJECTS AND SUMMARY OF THE INVENTION

It is the object of the invention to create a selective rotor ground-fault protection. In order to achieve this object, one or more current transformers are provided. When only one transformer is provided, the primary side of the transformer includes the power lines from the exciter source and the ground line while the secondary side includes a first relay. When a second transformer is provided, the primary side of the first transformer includes the power lines from the exciter source while the primary of the second transformer includes the ground line. The secondary of each transformer is connected to a first relay.

Essentially, the advantages of the invention can be seen in the fact that the first relay is actuated only by a ground fault in the rotor winding.

Further objects, preferred embodiments and further developments of the invention are found in the subsequent description of illustrative embodiments.

DETAILED DESCRIPTION OF THE PREFERRED EMBODIMENTS

Figure 1:
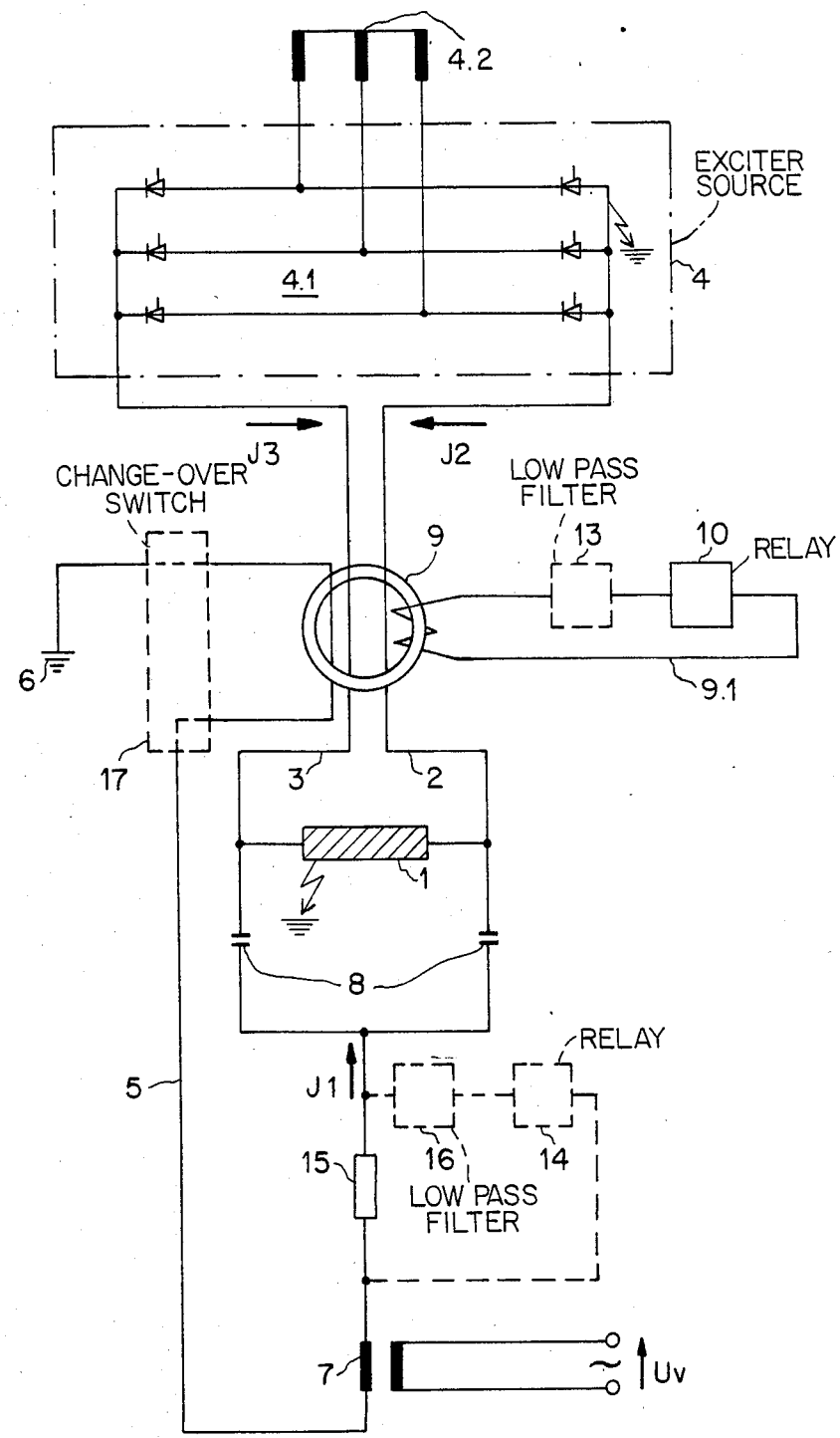
FIG. 1 shows an embodiment of the present invention including only one current transformer and several further developments shown in dashed lines.
Figure 2:
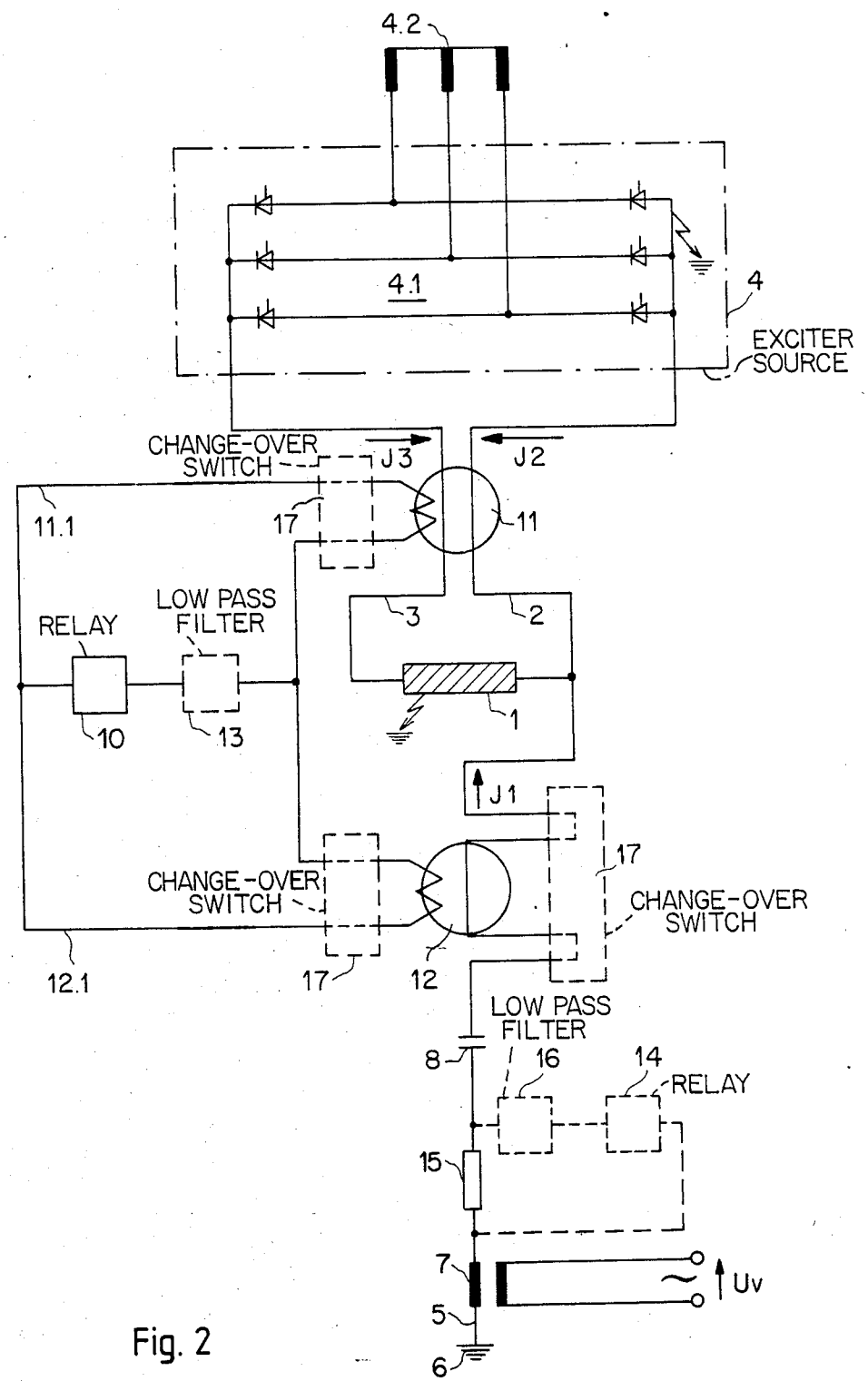
FIG. 2 shows an embodiment of the present invention including two current transformers and further developments, also shown in dashed lines.

FIGS. 1 and 2 are schematic circuit diagrams in which all circuit features which are not necessary for the immediate understanding of the invention are not shown. In all Figures, matching parts are provided with matching reference designations.

In FIG. 1, 1 designates a rotor winding which is connected via power lines 2 and 3 between the poles of an exciter source 4. The exciter source 4 is a direct-current source and, in the example of FIG. 1, is constructed as rectifier 4.1 which is connected via an exciter transformer 4.2 to an alternating-voltage source, not shown. From the rotor winding 1, a ground line 5 goes to ground 6. In the ground line 5, an alternating-voltage source 7 and one or several capacitors 8 are arranged in series. The alternating-voltage source 7 acts in known manner as an offset-voltage source. 9 designates a current transformer which is constructed as a bar-type or ring-core transformer. Its annular core encloses both the earth line 5 and the power lines 2 and 3 as primary windings. All three lines are carried with a single turn through the current transformer 9, the earth line 5 going from earth 6 to the rotor winding 1 and the power rails 2 and 3 from the exciter source 4 also to the rotor winding 1, with identical winding or directional sense in each case. In the secondary circuit 9.1 of the current transformer 9, a first relay 10 is arranged.

The current transformer 9 detects the sum of the currents flowing in the ground line 5 and in the power rails 2 and 3. In its secondary circuit 9.1, a secondary current flows which is proportional to this sum. The current in the ground line 5 is designated by $J_1$, the current in the power rail 2 by $J_2$ and the current in the power rail 3 by $J_3$. Corresponding to the winding or directional sense in which the ground line 5 and the power rails 2 and 3 are carried through the current transformer 9 as described before, the currents $J_1$, $J_2$ and $J_3$ are evaluated during the summing by the current transformer 9 with matching signs in direction of the rotor winding 1. Corresponding reference arrows are drawn in FIG. 1.

In the following, a condition without ground fault, a condition with a ground fault in the rotor winding and a condition with a ground fault, in the exciter source 4 are described in succession.

In the condition without ground fault, the circuit containing the alternating-voltage source 7 is closed virtually only via the natural ground capacity of the rotor winding 1. The current flowing through this ground capacity, however, is small and shall be neglected hereinafter. The resulting current $J_1$ in the earth line 5 is therefore zero. Via the rotor winding 1, an exciter current flows which is rectified by the current rectifier 4.1 in the exciter source 4. This current appears in the power rail 2 as current $J_2$ and in the power rail 3, with the same magnitude but the reverse sign, as current $J_3$. The sum of both currents $J_2$ and $J_3$ is zero. The magnetic fluxes caused by the currents $J_2$ and $J_3$ in the current transformer 9 just cancel. This also applies if the currents $J_2$ and $J_3$ are not ideal direct currents but carry superimposed harmonics generated by the current rectifier 4.1. In the secondary circuit 9.1 of the current transformer 9 no secondary current occurs which could actuate the first relay 10. The first relay 10 remains non-energised and does not indicate an earth fault.

In the case of a ground fault in the rotor winding 1, an earth current impressed by the alternating-voltage source 7 flows in the gound line 5 as current $J_1$. The currents $J_2$ and $J_3$ in the power rails are not affected by this ground current and flow as in the case without earth fault so that the magnetic flux caused by them in the current transformer 9 is cancelled again. However, a residual magnetic flux, which is caused by the current $J_1$ and which is variable in time, remains in the current transformer 9 which results in a secondary current in the secondary circuit 9.1. This secondary current causes the first relay 10 to pick up, which indicates the ground fault.

If the ground fault is located in the exciter source 4, current which flows in the ground line 5 as current $J_1$ and which is again impressed by the alternating-voltage source 7, is superimposed in the power rails 2 and 3 on the exciter current generated by the exciter source 4. The current $J_1$ passing through the current transformer 9 in the ground line 5 again passes through the transformer in the power rails 2 and 3 in the reverse direction. As a result, the sum of the currents $J_1$, $J_2$, $J_3$ or the magnetic flux caused by them in the current transformer 9 is equalised to zero as in the ground-fault-free case. In the secondary circuit 9.1 of the first current transformer 9, no secondary current flows. The first relay 10 remains non-energised.

The arrangement described indicates an ground fault only if it has formed in the rotor winding 1.

Since the magnetic fluxes caused by the component of the exciter current and its harmonics in the currents $J_1$ and $J_2$ in the current transformer 9 always mutually compensate, the current transformer 9 is advantageously not saturated even with a high exciter current. In addition, the harmonics remain without effect on the first relay 10.

In FIG. 2, an embodiment of the method of the solution including two current transformers, that is to say a first current transformer 11 and a second current transformer 12, is shown. Both current transformers 11 and 12 are constructed like the current transformer 9 as bar-type or ring-core transformers having an identical transformer core and identical secondary windings. The power rails 2 and 3 are carried as primary windings through the first current transformer 11 with matching winding or directional sense and as a single turn from the exciter source 4 to the rotor winding. Through the second current transformer 12, the ground line 5 is carried as primary winding, also with a single turn. The first relay is arranged in the parallel connected secondary circuits 11.1 and 12.1 of the first current transformer 11 and the second current transformer 12, respectfully. The embodiment according to FIG. 2 corresponds to the embodiment of FIG. 1 in all other features.

In the following, a condition without ground fault, a condition involving a ground fault in the rotor winding 1 and a condition involving a ground fault in the exciter source 4 are again described in succession.

In the condition without ground fault, no current flows in the ground line 5. A current flowing through the natural ground capacity of the rotor winding 1 shall be neglected again. Thus, no secondary current is generated in the secondary circuit 12.1 of the second current transformer 12. In the power rails 2 and 3, currents $J_2$ and $J_3$ flow which are of identical magnitude but opposite in sign. The magnetic fluxes caused by these currents in the first current transformer 11 equalise to zero. No secondary current is generated in the secondary circuit 11.1 of the first current transformer 11, either. The first relay 10 remains non-energised.

In the case of a ground fault in the rotor winding 1, current flows as current $J_1$ in the ground line 5 and generates a secondary current in the secondary circuit 12.1 via the second current transformer 12. The ground current does not appear on the power rails 2 and 3 and thus in the first current transformer 11. The currents $J_2$ and $J_3$ correspond to the case without ground fault. The magnetic flux generated by them in the first current transformer 11 is balanced. No further secondary current is generated in the secondary circuit 11.1. The secondary current generated in the secondary circuit 12.1 actuates the first relay 10 to thereby indicate the ground fault.

In the case of a ground fault in the exciter source 4, current flows as current $J_1$ in the ground line 5, passes through the second current transformer 12, appears, superimposed on the exciter current, and also in the power rails 2 and 3 in the currents $J_2$ and $J_3$ and thus also passes through the first current transformer 11. In the secondary circuits 11.1 and 12.1 of both current transformers 11 and 12, secondary currents are generated. If, as assumed, the transformer cores and the secondary windings of the current transformers 11 and 12 are largely identical, the secondary currents generated are also approximately of equal magnitude. By suitable choice of the winding or directional sense of the ground line 5 in the second current transformer 12 and of the winding sense of the secondary windings of the first current transformer 11 and the second current transformer 12, the secondary currents can be made to flow in opposite directions and to compensate each other. The first relay 10 then will not sense any resulting secondary current and accordingly remains non-energised.

In the embodiment according to FIG. 2, a ground fault is also indicated only if it has formed in the rotor winding 1.

In both embodiments, preferably, however, in the embodiment of FIG. 2, the first relay 10 can be preceded in the circuit by a first low-pass filter 13. The low-pass filter 13 advantageously blocks harmonics generated by the current rectifier 4.1, which could adversely affect the first relay 10.

Both methods of the solution according to the invention in the embodiments of FIG. 1 and FIG. 2 can advantageously be developed further in such a manner that a ground fault outside the rotor winding 1 is also detectable.

For this purpose, a second relay, designated by 14 in FIGS. 1 and 2, can be provided. The second relay 14 is preferably connected in parallel with a ground resistance 15 arranged in the earth line 5 and detects, for example, the voltage dropped across this earth resistance in the case of a ground fault. The second relay picks up as soon as, in the case of an ground fault, a current $J_1$ flows in the ground line 5, independently of where this ground fault has formed in the rotor circuit. If only the second relay 14 picks up and not the first relay 10, ground fault is present outside the rotor winding 1. If both relays pick up jointly, an earth fault is present in the rotor winding 1. The second relay 14 can also be preceded in the circuit by a second low-pass filter 16 for blocking the harmonics.

In a further embodiment, a change-over switch 17 can also be provided in the arrangements of FIGS. 1 and 2. The change-over switch 17 is arranged in the ground line 5 in the embodiment of FIG. 1. In the arrangement of FIG. 2, the change-over switch 17 can be arranged either in the ground line 5 or in the secondary circuit 11.1 of the first current transformer 11 or in the secondary circuit 12.1 of the second current transformer 12. In all these possible arrangements, a change-over switch 17 is drawn in dashed lines in the FIGS. 1 and 2.

The change-over switch 17 can be a single or a dual change-over switch.

As a dual change-over switch, it is used, depending on its chosen arrangement, to reverse either the winding or directional sense of the ground line 5 in the current transformer 9 in the embodiment according to FIG. 1, the winding or directional sense of the ground line 5 in the second current transformer 12 in the embodiment of FIG. 2, the winding or directional sense of the secondary winding of the first current transformer 11 or the second current transformer 12, also in the embodiment of FIG. 2.

The reversal of the winding or directional sense of the said lines or secondary windings does not have any effects whatever in the ground-fault-free condition since in this case no current flows either in the ground line 5, or in the secondary circuits 11.1 or 12.1 as explained before.

In the case of a ground fault in the rotor winding 1, only current flows as current $J_1$ in the ground line 5. The magnetic flux caused by this ground current in the current transformer 9 or in the second current transformer 12, respectively, cannot be affected by actuating the dual change-over switch 17 if the change-over switch 17 is arranged in the ground line 5 or in the secondary circuit of the second current transformer 12. The relay 10 picks up as before.

If the dual change-over switch 17 is arranged in the secondary circuit 11.1 of the first current transformer 11, operating it has no effect whatever since no current is generated in the secondary circuit 11.1 via this current transformer 11. The first relay 10 picks up also in this arrangement of the dual change-over switch, independently of its switch position.

If the ground fault is located in the exciter source 4, no more compensation occurs of the magnetic fluxes in the current transformer 9 in the embodiment of FIG. 1 or of the secondary currents in the secondary circuits 11.1 and 12.1 of the first current transformer 11 and the second current transformer 12 in the embodiment of FIG. 2 after the dual change-over switch 17 is actuated. The magnetic fluxes in the current transformer 9 and the secondary currents in the secondary circuits 11.1 and 12.1 are now rectified and add up to twice the amount. The first relay 10 picks up reliably.

The dual change-over switch 17 is preferably first set to the last-described switch position in which no compensation occurs of the magnetic fluxes or of the secondary currents. The first relay 10 then indicates ground faults in the whole rotor circuit, independently of their location. After the first relay 10 has been actuated, the dual change-over switch 17 can then be actuated in order to obtain an indication which is selective with respect to the location of the ground fault. If the first relay 10 remains energised after the switching process, a ground fault is present in the rotor winding 1. If the energisation disappears, the ground fault is located outside the rotor winding 1.

Figure 3:
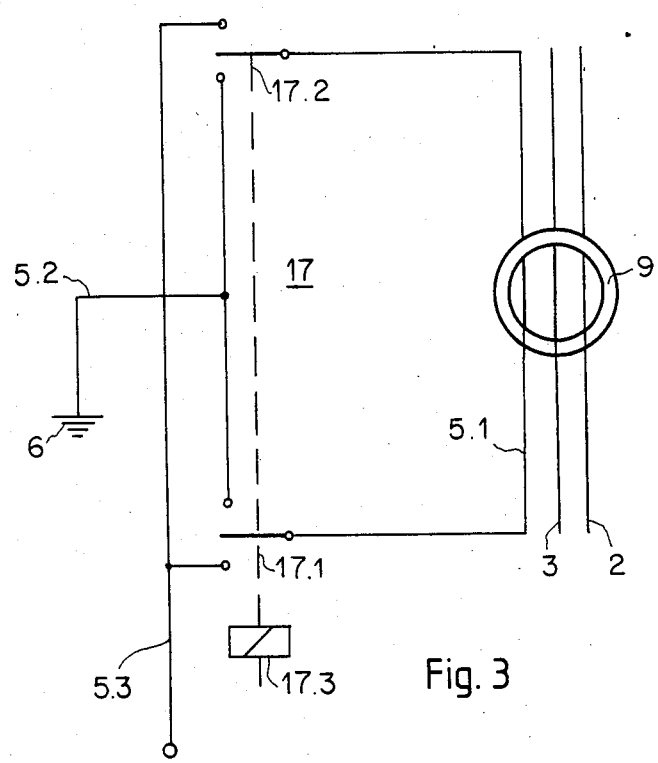
FIG. 3 shows a first electro-mechanical embodiment of a dual change-over switch in the ground line.

A first illustrative embodiment of a dual change-over switch 17, for example arranged in the ground line 5 in the embodiment of FIG. 1, is shown in FIG. 3. The dual change-over switch 17 is provided with a first change-over switch 17.1 and a second change-over switch 17.2 which can be jointly actuated by a preferably electromechanical drive 17.3. Due to the dual change-over switch 17, the ground line 5 is subdivided into three line sections 5.1, 5.2 and 5.3: a line section 5.1 which passes through the current transformer 9, a line section 5.2 at the earth side and a line section 5.3 at the side of the rotor winding. The change-over switches 17.1 and 17.2 are arranged at the ends of the line section 5.1 and connect these ends in each case in the opposite sense to the line sections 5.2 and 5.3.

Figure 4:
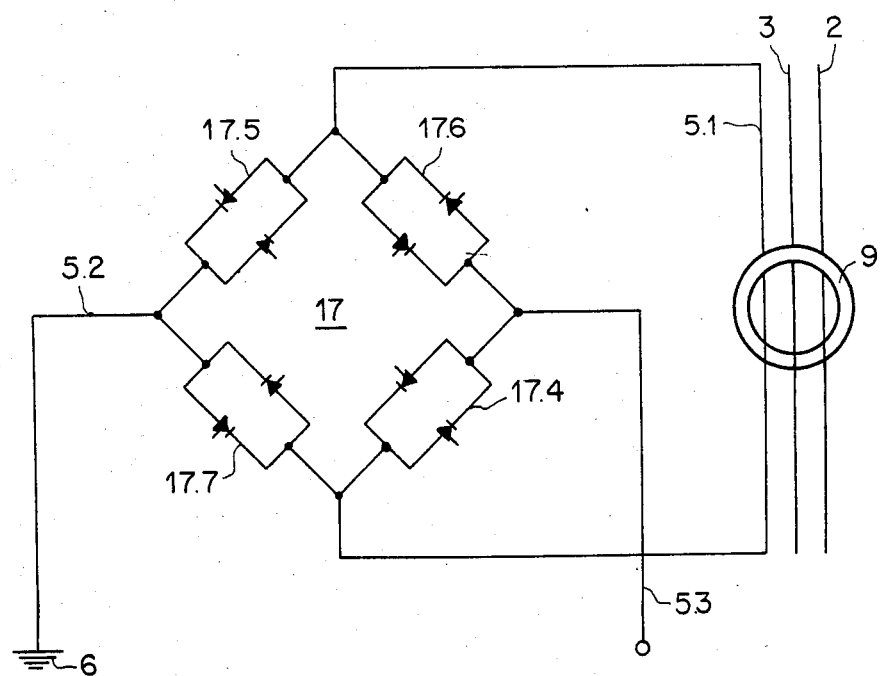
FIG. 4 shows a second electronic embodiment of a dual change-over switch, also in the ground line.

A second illustrative embodiment of a dual change-over switch 17 is shown in FIG. 4. This switch is here constructed as a bridge circuit which is again arranged, for example, in the ground line 5 in the embodiment of FIG. 1. In each part-branch of the bridge circuit, one pair of anti-parallel thyristors 17.4, 17.5, 17.6 and 17.7 is arranged as switching element. By firing thyristor pairs 17.4 and 17.5 or 17.6 and 17.7, which are in each case opposite in the bridge circuit, by means of a firing and control device, not shown, the line section 5.1 located in one diagonal branch of the bridge circuit is connected in one or the other winding or directional sense with respect to the current transformer 9 to the line sections 5.2 and 5.3. A change-over switch constructed in this manner is very fast acting. It is predominantly used if switching must take place within a few milliseconds.

As has already been mentioned above, the change-over switch 17 can also be constructed as a single change-over switch. As a single-type model it is used for changing, for example, doubling, the number of turns of the respective line in which it is arranged in the respective current transformer. In this case, a clear selective detection of a ground fault can also be achieved via a comparison of the magnitudes of the secondary currents generated before and after actuation of the single-type change-over switch 17.

If a ground fault in the rotor winding 1 has been selectively detected by using one of the abovementioned methods and if the electric machine is to be shut down, a whole number of switching processes such as, for example, the interruption of the rotor circuit must be carried out as a rule. Shutdown is preferably automatic and the necessary switching signals are also automatically generated either directly by the first relay 10 or by a separate control unit, not shown in the drawings. This control unit can be used for taking into consideration also the state of energisation of the second relay 14, if present, before generating the shutdown commands. If the change-over switch 17 is used, the control device can be used for automatically actuating it after the first relay 10 has been actuated and for deciding if the energisation of the first relay 10 remains or disappears after actuation. In order to accomplish these tasks, the control device can be constructed in the customary manner from conventional circuits and for this reason does not need to be described in greater detail.

I claim:

1. A device detecting a ground fault in the rotor winding of an electric machine comprising:
    an exciter source;
    a source line connecting said exciter source with one end of said rotor winding;
    a return line connecting said exciter source with another end of said rotor winding;
    a current transformer the primary side of which includes said source line and said return line, and the secondary side of which includes a relay, electric current in said source line and said return line causing a zero net magnetic flux in said current transformer in the absence of a ground fault;

a capacitor;

an alternating voltage source; and a ground line connecting said rotor winding, said capacitor and said alternating voltage source in series to ground;

said current transformer including said ground line as a primary winding so that, with a ground fault in the rotor winding a non-zero net magnetic flux is caused in said current transformer to actuate said relay.

2. A device detecting a ground fault in the rotor winding of an electric machine comprising:

an exciter source;

a source line connecting said exciter source with one end of said rotor winding;

a return line connecting said exciter source with another end of said rotor winding;

a first current transformer the primary side of which includes said source line and said return line, electric current in said source line and said return line causing a zero net magnetic flux in said first current transformer in the absence of a ground fault;

a capacitor;

an alternating voltage source;

a ground line connecting said rotor winding, said capacitor and said alternating voltage source in series to ground;

a second current transformer the primary side of which includes said ground line, secondary sides of said first current transformer and said second current transformer connected in parallel and having a common circuit leg; and a relay connected in said common circuit leg, said first current transformer and said second current transformer generating an electric current in said common circuit leg in the presence of a ground fault in said rotor winding, said relay operating in response to said electric current in said common circuit leg.

3. A device according to one of claims 1 or 2, wherein the relay is preceded in the circuit of the secondary by a low-pass filter.

4. A device according to claim 1, wherein the current transformer is constructed as a ring-core transformer.

5. A device according to claim 2, wherein the first and the second transformer are each provided with a transformer core, the transformer cores of said first and second transformers and the secondary windings of said first and second transformers being substantially identical, respectively.

6. A device according to claim 3, wherein a second relay is provided which is connected in parallel with a ground resistor connected in the ground line.

7. A device according to claim 6, wherein the second relay is preceded in the secondary side by a second low-pass filter.

8. A device according to claim 2 wherein the first and second transformers are constructed as ring-core transformers.

9. A device according to claim 1 and further including a dual change-over switch arranged so that the effective winding direction of the ground line can be reversed.

10. A device according to claim 1 and further including a single change-over switch arranged so that the number of turns of the ground line can be changed.

11. A device according to claim 2, wherein the relay is preceded in the circuit of the secondary by a low-pass filter.

12. A device according to claim 11, wherein a second relay is provided which is connected in parallel with a ground resistor connected in the ground line.

13. A device according to claim 12, wherein the second relay is preceded in the secondary side by a second low-pass filter.

14. A device according to claim 13 and further including a dual change-over switch arranged so that the effective winding direction of one of the following can be reversed: the ground line in the second current transformer, the secondary winding of the first current transformer, and the secondary winding of the second current transformer.

15. A device according to claim 13 and further including a single change-over switch arranged so that the number of turns of one of the following can be changed: the ground line in the second current transformer, the secondary winding of the first current transformer, and the secondary winding of the second current transformer.

* * * * *